US006870604B2

(12) United States Patent
Kanatake

(10) Patent No.: US 6,870,604 B2
(45) Date of Patent: Mar. 22, 2005

(54) HIGH RESOLUTION POINT ARRAY

(75) Inventor: Takashi Kanatake, Torokozawa (JP)

(73) Assignee: Ball Semiconductor, Inc., Allen, TX (US)

(*) Notice: Subject to any disclaimer, the term of this patent is extended or adjusted under 35 U.S.C. 154(b) by 0 days.

(21) Appl. No.: 10/421,326

(22) Filed: Apr. 23, 2003

(65) Prior Publication Data

US 2004/0004699 A1 Jan. 8, 2004

Related U.S. Application Data

(60) Provisional application No. 60/319,201, filed on Apr. 23, 2002.

(51) Int. Cl.⁷ .......................... G03B 27/32; G03B 27/42
(52) U.S. Cl. .......................................... 355/77; 355/53
(58) Field of Search ........................ 355/53, 77; 430/5, 430/22, 30

(56) References Cited

U.S. PATENT DOCUMENTS

| | | | | |
|---|---|---|---|---|
| 3,534,467 A | * | 10/1970 | Sachs et al. | |
| 4,126,812 A | * | 11/1978 | Wakefield | |
| 4,744,047 A | * | 5/1988 | Okamoto et al. | |
| 4,879,466 A | * | 11/1989 | Kitaguchi et al. | |
| 5,049,901 A | * | 9/1991 | Gelbart | |
| 5,079,544 A | * | 1/1992 | DeMond et al. | |
| 5,082,755 A | * | 1/1992 | Liu | |
| 5,106,455 A | * | 4/1992 | Jacobsen et al. | |
| 5,109,290 A | * | 4/1992 | Imai | |
| 5,121,983 A | * | 6/1992 | Lee | |
| 5,131,976 A | * | 7/1992 | Hoko | |
| 5,132,723 A | * | 7/1992 | Gelbart | |
| 5,138,368 A | * | 8/1992 | Kahn et al. | |
| 5,208,818 A | * | 5/1993 | Gelbart et al. | |
| 5,269,882 A | * | 12/1993 | Jacobsen | |
| 5,281,996 A | * | 1/1994 | Bruning et al. | |
| 5,300,966 A | * | 4/1994 | Uehira et al. | |
| 5,361,272 A | * | 11/1994 | Gorelik | |
| 5,416,729 A | * | 5/1995 | Leon et al. | |
| 5,431,127 A | * | 7/1995 | Stevens et al. | |
| 5,461,455 A | * | 10/1995 | Coteus et al. | |

(List continued on next page.)

FOREIGN PATENT DOCUMENTS

| | | |
|---|---|---|
| EP | 0552953 | 7/1993 |
| WO | WO 9110170 | 7/1991 |

OTHER PUBLICATIONS

"New Multi–EB Direct WRite Concept for Maskless High Throughput", Canon SubMicron Focus, vol. 5, Summer 2000.

Sandstrom and Odselius, "Large–Area High Quality Photomasks", Micronic Laser Systems, published by SPIE, vol. 2621, 1985, pp. 312–318.

Singh–Gasson, Sangeet et al., "Maskless Fabrication of Light–Directed Oligonucleotide Microarrays Using a Digital Micromirror Array", vol. 17, No. 10, Oct. 1999, pp. 974–978.

Devitt, Terry, "Advanced May Put Gene Chip Technology on Scientists Desktops", http://www.biotech.wise.edu/Education/biotechnews/GeneChip.html, Oct. 7, 1999.

*Primary Examiner*—Rodney Fuller
(74) *Attorney, Agent, or Firm*—Haynes and Boone, LLP

(57) ABSTRACT

A method for increasing a scan rate in a photolithography system by increasing a unit travel length while maintaining a minimum resolution is provided. The method includes determining the minimum resolution and a pixel spacing distance equal to the unit travel length. The method also includes calculating a window size based on the minimum resolution and the pixel spacing distance. A plurality of windows of the calculated size are established so that a pixel in a first window is offset from a pixel in a second window by the minimum resolution in a first dimension and the pixel spacing distance in a second dimension, and one of the plurality of windows is selected for projection onto a subject.

13 Claims, 14 Drawing Sheets

U.S. PATENT DOCUMENTS

| | | | | |
|---|---|---|---|---|
| 5,691,541 | A | * | 11/1997 | Ceglio et al. |
| 5,793,473 | A | * | 8/1998 | Koyama et al. |
| 5,818,498 | A | * | 10/1998 | Richardson et al. |
| 5,870,176 | A | * | 2/1999 | Sweatt et al. |
| 5,892,231 | A | * | 4/1999 | Baylor et al. |
| 5,900,637 | A | * | 5/1999 | Smith |
| 5,905,545 | A | * | 5/1999 | Poradish et al. |
| 5,909,658 | A | * | 6/1999 | Clarke et al. |
| 5,949,557 | A | * | 9/1999 | Powell |
| 5,955,776 | A | * | 9/1999 | Ishikawa |
| 5,995,129 | A | * | 11/1999 | Sunagawa et al. |
| 5,995,475 | A | * | 11/1999 | Gelbart |
| 5,998,069 | A | * | 12/1999 | Cutter et al. |
| 6,014,203 | A | * | 1/2000 | Ohkawa |
| 6,048,011 | A | * | 4/2000 | Fruhling et al. |
| 6,052,517 | A | * | 4/2000 | Matsunaga et al. |
| 6,061,118 | A | * | 5/2000 | Takeda |
| 6,071,315 | A | * | 6/2000 | Ramamurthi et al. |
| 6,072,518 | A | * | 6/2000 | Gelbart |
| 6,084,656 | A | * | 7/2000 | Choi et al. |
| 6,107,011 | A | * | 8/2000 | Gelbart |
| 6,124,876 | A | * | 9/2000 | Sunagawa |
| 6,133,986 | A | * | 10/2000 | Johnson |
| 6,205,364 | B1 | * | 3/2001 | Lichtenstein et al. |
| 6,251,550 | B1 | * | 6/2001 | Ishikawa |
| 6,658,315 | B2 | * | 12/2003 | Chan .......................... 700/121 |

* cited by examiner

1

HIGH RESOLUTION POINT ARRAY

CROSS REFERENCE

This application claims priority to U.S. Provisional Patent Application Ser. No. 60/319,201, filed on Apr. 23, 2002.

BACKGROUND

The present invention relates generally to optical scanning systems, and more particularly, to a system and method for increasing a scan rate while maintaining a minimum resolution.

Digital scanning systems, such as those used in maskless photolithographic processing, require image data to be scanned onto a subject. The scanning may occur at a defined scan rate, which may be based on factors such as mechanical limitations and the speed with which data is processed and projected onto the subject. A system may also controllably alter the scan rate to achieve different objectives.

The amount of image data that must be processed in a digital scanning system is generally relatively large, and generally increases when higher resolutions are desired. Higher resolution may be desirable for a number of reasons. For example, a line may have a minimum width when projected at a certain resolution. This minimum width may be undesirable, for instance, because it limits the number of lines which may be projected onto the subject. Using a higher resolution may allow the line to be projected using a smaller minimum width, and so more lines may be projected onto the subject. In photolithography, the subject may be a substrate and the projected image may be a mask. Therefore, a higher resolution enables a more detailed mask to be projected onto the substrate without altering the size of the substrate.

Although sometimes desirable, higher resolutions may decrease the scan rate of a scanning system because of the amount of data that must be transferred. This is especially true if the scanning system has a fixed data rate which is operable to transfer a limited amount of data.

Therefore, certain improvements are needed in digital imaging systems. For example, it is desirable to increase the scan rate of a system while maintaining a desired minimum level of resolution. It is also desirable to maintain high light intensity, to provide high productivity, and to be more flexible and reliable.

SUMMARY

A technical advance is provided by a novel system and method for increasing a scan rate while maintaining a minimum resolution in an optical imaging system. In one embodiment, the method comprises determining a minimum resolution and a spacing distance for a first discrete element and a second discrete element. A window size is calculated based on the minimum resolution and the spacing distance and the window size is set equal to the calculated size. An angle of rotation is calculated for the projection device relative to a subject based on the window size, where angle of rotation operable to offset the first discrete element from the second discrete element by the minimum resolution.

DETAILED DESCRIPTION

Figure 1:
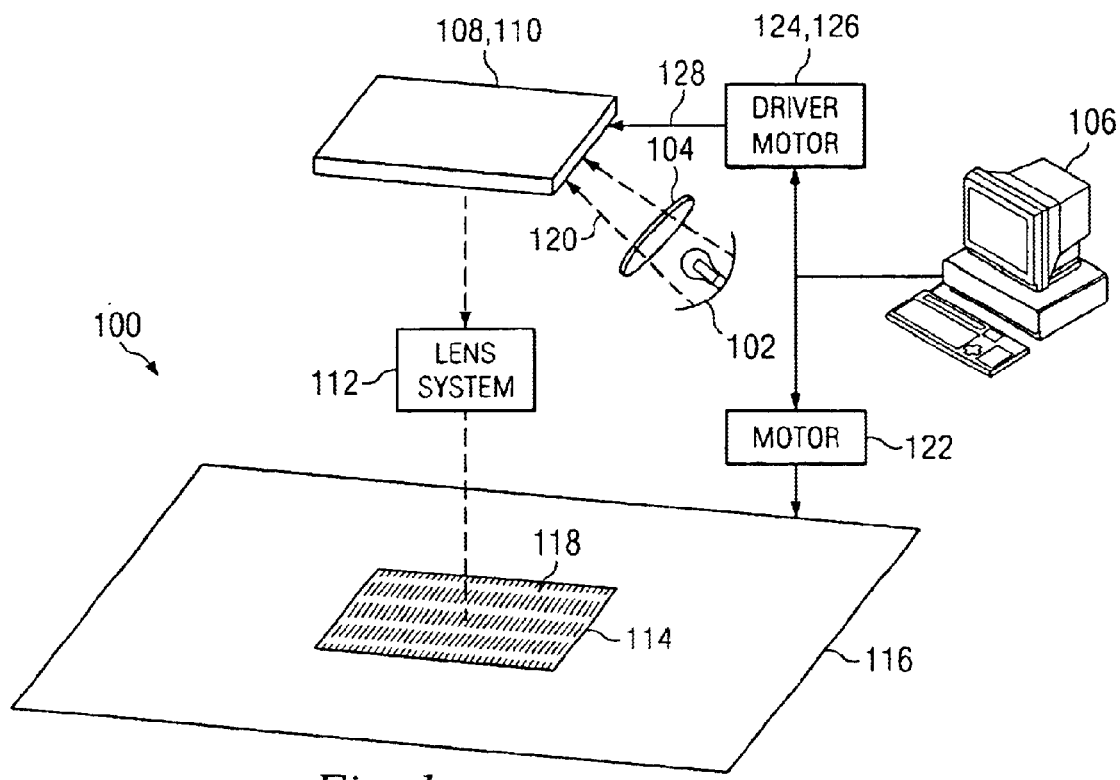
FIG. 1 is a diagrammatic view of an improved digital photolithography system for implementing various embodiments of the present invention.

The present invention relates generally to optical scanning systems, and more particularly, to a system and method for increasing a scan rate while maintaining a minimum resolution. It is understood, however, that the following disclosure provides many different embodiments, or examples, for implementing different features of the invention. Specific examples of components and arrangements are described below to simplify the present disclosure. These are, of course, merely examples and are not intended to limit the invention from that described in the claims. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, a maskless photolithography system 100 is one example of a system that can benefit from the present invention. In the present example, the maskless photolithography system 100 includes a light source 102, a first lens system 104, a computer aided pattern design system 106, a pixel panel 108, a panel alignment stage 110, a second lens system 112, a subject 114, and a subject stage 116. A resist layer or coating 118 may be disposed on the subject 114. The light source 102 may be an incoherent light source (e.g., a Mercury lamp) that provides a collimated beam of light 120 which is projected through the first lens system 104 and onto the pixel panel 108.

The pixel panel 108, which may be a digital mirror device (DMD), is provided with digital data via suitable signal line(s) 128 from the computer aided pattern design system 106 to create a desired pixel pattern (the pixel-mask pattern). The pixel-mask pattern may be available and resident at the pixel panel 108 for a desired, specific duration. Light emanating from (or through) the pixel-mask pattern of the pixel panel 108 then passes through the second lens system 112 and onto the subject 114. In this manner, the pixel-mask pattern is projected onto the resist coating 118 of the subject 114.

The computer aided mask design system 106 can be used for the creation of the digital data for the pixel-mask pattern. The computer aided pattern design system 106 may include computer aided design (CAD) software similar to that which is currently used for the creation of mask data for use in the manufacture of a conventional printed mask. Any modifications and/or changes required in the pixel-mask pattern can be made using the computer aided pattern design system 106. Therefore, any given pixel-mask pattern can be changed, as needed, almost instantly with the use of an appropriate instruction from the computer aided pattern design system 106. The computer aided mask design system 106 can also be used for adjusting a scale of the image or for correcting image distortion.

In some embodiments, the computer aided mask design system 106 is connected to a first motor 122 for moving the stage 116, and a driver 124 for providing digital data to the pixel panel 108. In some embodiments, an additional motor 126 may be included for moving the pixel panel. The system 106 can thereby control the data provided to the pixel panel 108 in conjunction with the relative movement between the pixel panel 108 and the subject 114.

Efficient data transfer may be one aspect of the system 106. Data transfer techniques, such as those described in U.S. provisional patent application Ser. No. 60/278,276, filed on Mar. 22, 2001, and also assigned to Ball Semiconductor, Inc., entitled "SYSTEM AND METHOD FOR LOSSLESS DATA TRANSMISSION" and hereby incorporated by reference as if reproduced in its entirety, may be utilized to increase the throughput of data while maintaining reliability. Some data, such as high resolution images, may present a challenge due in part to the amount of information needing to be transferred.

Figure 2:
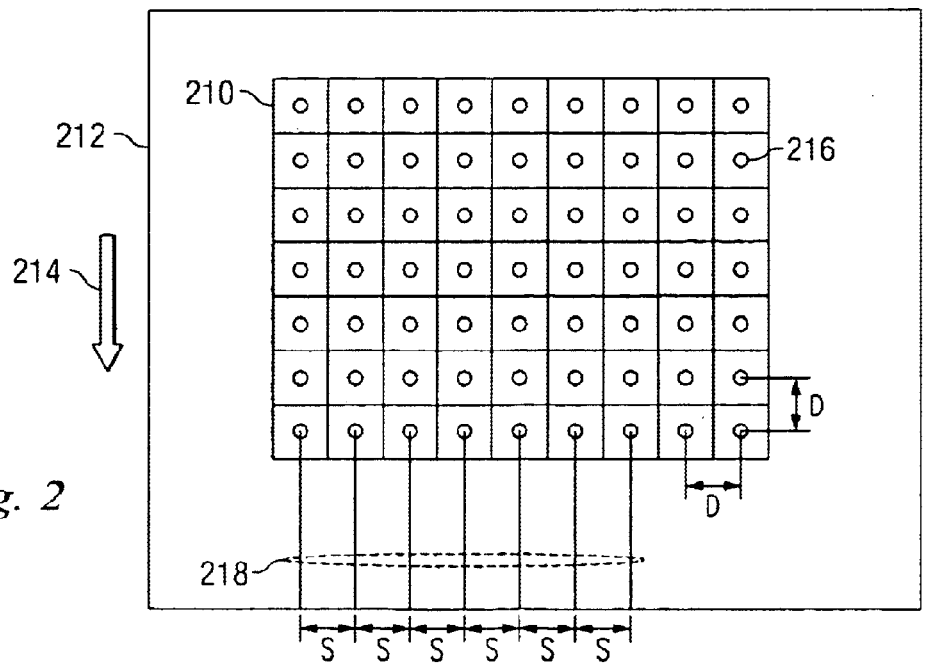
FIG. 2 illustrates an exemplary point array aligned with a subject.

Referring now to FIG. 2, a pixel panel 210 comprising a DMD, which may be present in a system such as that described above with reference to FIG. 1, is illustrated. The pixel panel 210, which is shown as a point array for purposes of clarification, projects an image (not shown) upon a substrate 212. The substrate is moving in a direction indicated by an arrow 214. Alternatively, the point array 210 could be in motion while the substrate 212 is stationary, or both the substrate 212 and the point array 210 could be moving simultaneously. The point array 210 is aligned with both the substrate 212 and the direction of movement 214 as shown. A distance, denoted for purposes of illustration as "D", separates individual points 216 of the point array 210. In the present illustration, the point distribution that is projected onto the subject 212 is uniform, which means that each point 216 is separated from each adjacent point 216 both vertically and horizontally by the distance D.

As the substrate 212 moves in the direction 214, a series of scan lines 218 indicate where the points 216 may be projected onto the substrate 212. The scan lines are separated by a distance "S". Because of the alignment of the point array 210 with the substrate 212 and the scanning direction 214, the distance S between the scan lines 218 equals the distance D between the points 216. In addition, both S and D remain relatively constant during the scanning process. Achieving a higher resolution using this alignment typically requires that the point array 210 embodying the DMD be constructed so that the points 216 are closer together. Therefore, the construction of the point array 210 and its alignment in relation to the substrate 212 limits the resolution which may be achieved.

Figure 3:
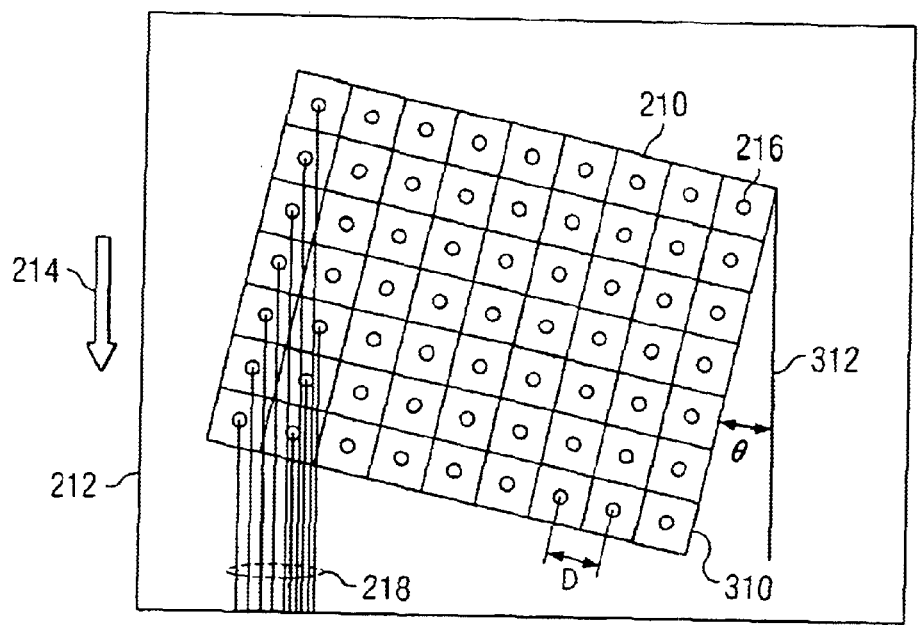
FIG. 3 illustrates the point array of FIG. 2 after being rotated relative to the subject.

Referring now to FIG. 3, a higher resolution may be achieved with the point array 210 of FIG. 2 by rotating the DMD embodying the point array 210 in relation to the substrate 212. As illustrated in FIG. 3, although the distance D between the points 216 remains constant, such a rotation may reduce the distance S between the scan lines 218, which effectively increases the resolution of the point array 210. The image data that is to be projected by the point array 210 may be manipulated so as to account for the rotation of the point array 210. The manipulation can include an angle θ between an axis 310 of the rotated point array 210 and a corresponding axis 312 of the substrate.

The magnitude of the angle θ may be altered to vary the distance S between the scan lines 218. If the angle θ is relatively small, the resolution increase may be minimal as the points 216 will remain in an alignment approximately equal to the alignment illustrated in FIG. 2. As the angle θ increases, the alignment of the points 216 relative to the substrate 212 will increasingly resemble that illustrated in FIG. 3. If the angle θ is increased to certain magnitudes, various points 216 will be aligned in a redundant manner and so fall onto the same scan line 218. Therefore, manipulation of the angle θ permits manipulation of the distance S between the scan lines 218, which affects the resolution of the point array 210. It is noted that the distance S may not be the same between different pairs of scan lines as the angle θ is altered.

Figure 4:
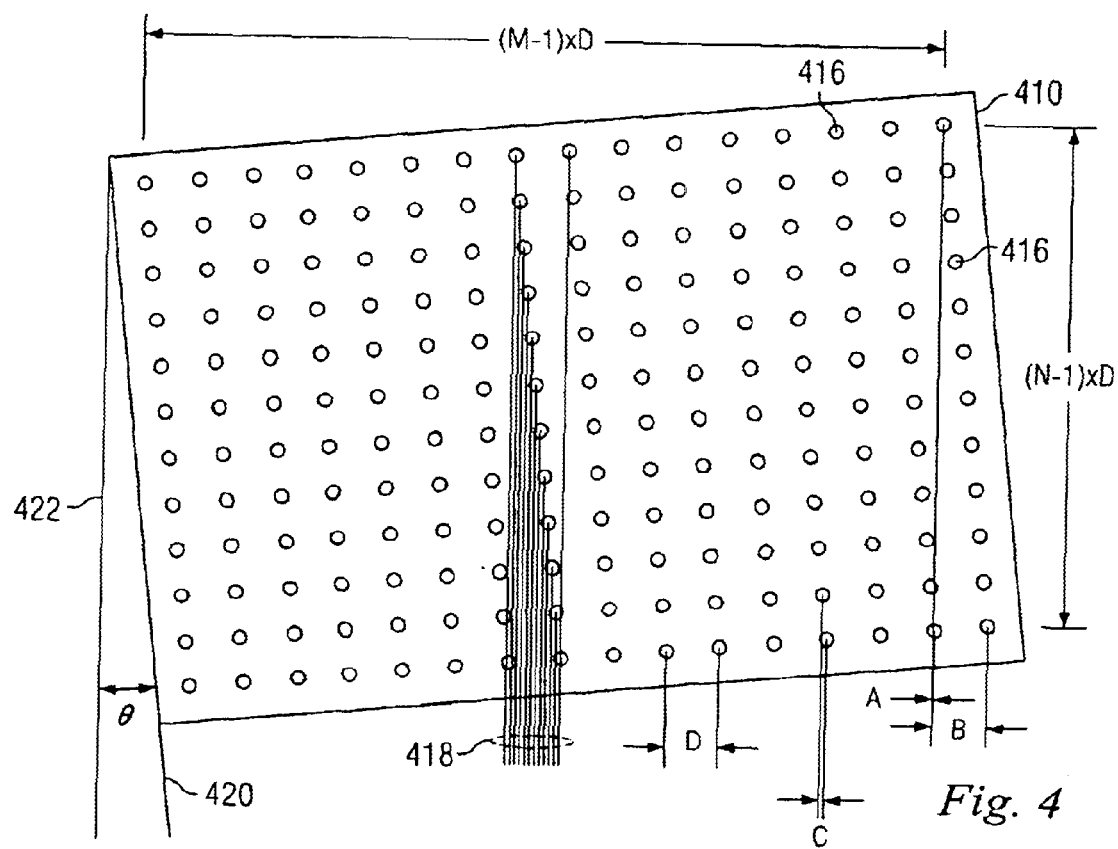
FIG. 4 illustrates a point array rotated so that only one point falls on a single vertical line.

Referring now to FIG. 4, a pixel panel 410 (again shown as a point array) comprising M columns by N rows is illustrated. In the present example, M=16 and N=12. The point array 410 may represent an image, such as an image used in a maskless photolithography system. Each column and row includes a plurality of individual points 416. For purposes of illustration, each point 416 will be referenced by its column/row position in the point array 410 when it is important to identify a particular point. For example, the point 416 located in the second column, fourth row, will be referred to as point (2,4). Each point 416 is separated by a distance "D" from the corresponding point in the adjacent columns and rows. For example, the point (10,11) is a distance D from point (9,11), point (11,11), point (10,10), and point (10,12). Therefore, the total distance between the first and last points 416 in each row is equal to (M−1)*D, while the total distance between the first and last points 416 in each column is (N−1)*D.

An angle θ represents the angle between an axis 420 of the point array 410 and a corresponding axis 422 of a subject 412 (not shown). A series of scan lines 418 indicate where the points 416 may be projected onto the subject 412. Depending on the angle θ, the scan lines 418 may be separated by a constant distance or by varying distances, as described below. When no redundancy occurs (i.e., no two points 416 from the array 410 may fall on the same scan line 418), a variable "K" is equal to one, signifying a one to one correspondence between a point 416 and a scan line 418. A series of relationships may be developed using the values M, N, K, D and θ. The relationships enable various aspects of the rotation of the array 410 to be calculated in order to achieve a desired result.

A distance "B", which designates the distance between the scan lines 418 of two adjacent points 416 in a row when the array 410 is rotated to angle θ, may be calculated by setting B equal to D*cos(θ). A distance "C" represents the distance between the scan lines 418 of two adjacent points 416 in a column when the array 410 is rotated to angle θ, and may be calculated by setting C equal to D*sin(θ). A distance "A" represents the distance between the scan lines 418 of the point 416 in the bottom row of a column and the point 416 in the top row of the next column when the array 410 is rotated to angle θ. For example, the scan lines associated with the point (15,12) and the point (16,1) are separated by the distance A, which may be calculated as B−(N−1)*D*sin(θ).

In the present example, the points 416 are uniformly distributed (i.e., the same distance separates each point 416 from the adjacent points 416 when projected onto the subject). When this uniformity occurs, A=C=D*sin(θ) and tan(θ)=K/N.

Using one or more of these relationships, the angle θ can be calculated to achieve a desired distance between the scan lines 418. For example, when N=600 and K=1, then θ=tan⁻¹(1/600)≈0.0955 degrees. Therefore, rotating the point array 410 by 0.0955 degrees will enable the array 410 to be projected with the desired characteristics of A, B, C and D.

It should be noted that choosing a uniform distribution of points 416 may simplify the calculation of θ and its effect on the resolution provided by the spacing of the scan lines 418. This may be accomplished by selecting a desired resolution so that A=C=D*sin(θ).

Figure 5:
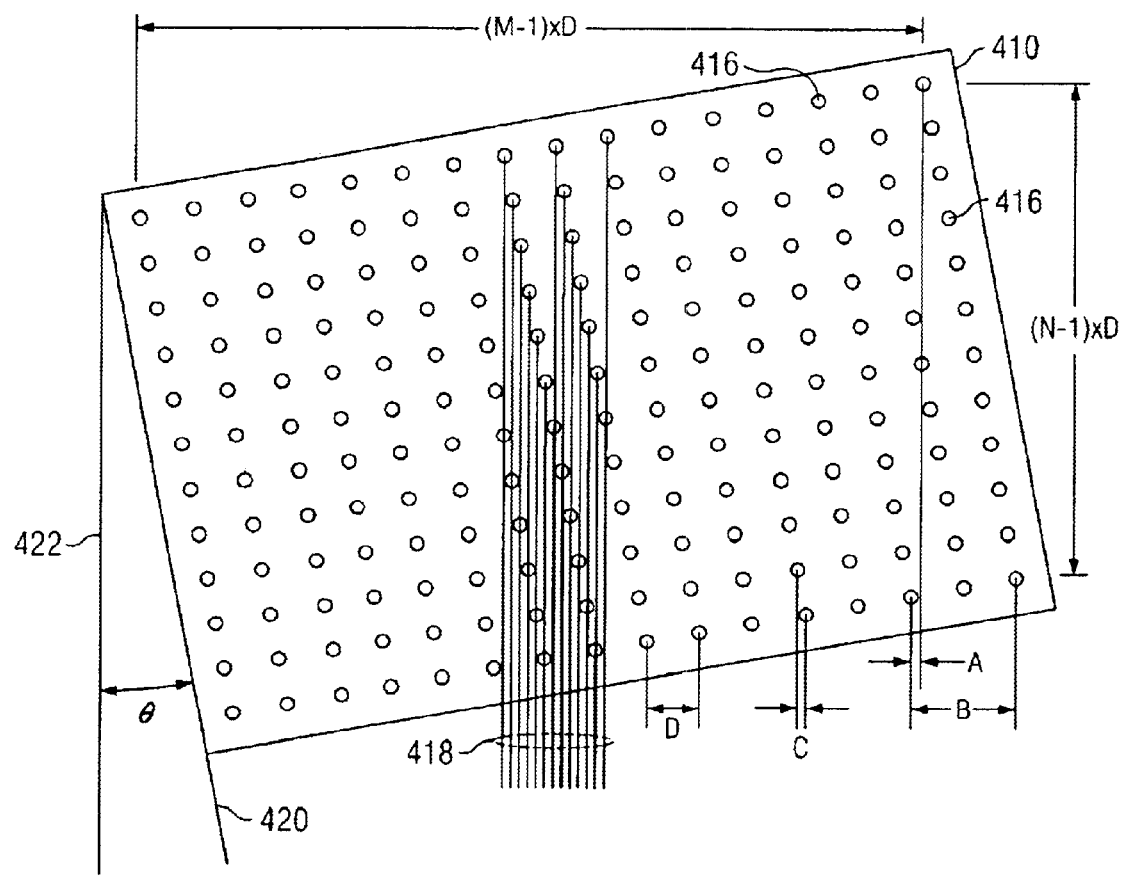
FIG. 5 illustrates the point array of FIG. 4 rotated so that two points fall on a single vertical line.

Referring now to FIG. 5, the point array 410 of FIG. 4 is illustrated with a larger angle θ. In contrast to FIG. 4, the present figure depicts an example where K=2. This means that there is redundancy such that two points 416 from the array 410 fall on the same scan line 418 (i.e., there is a two to one correspondence between two points 416 and a scan line 418). For example, the point (8,1) and the point (7,7) are associated with the same scan line 418. Such redundancy may be desirable if, among other reasons, the DMD includes a faulty mirror. If the mirror associated with one of the points on a scan line fails, a redundant mirror may be utilized to ensure the point is properly projected.

The distance "D" separates each point 416 from the adjacent points 416. The total distance between the first and last points 416 in each row is equal to (M−1)*D, while the total distance between the first and last points 416 in each column is (N−1)*D. Using M, N, K, D and θ, a series of relationships may be developed for K=2. As in FIG. 4, the relationships may enable various aspects of the rotation of the array 410 to be calculated in order to achieve a desired result.

The distance "B" designates the distance between the scan lines 418 of two points in a row separated by another point 416 when the array 410 is rotated to angle θ. For example, the point (14,12) is separated from the point (16,12) by the distance b, which may be calculated as B=K*D*cos(θ). The distance "C" may be calculated as C=D*sin(θ). The distance "A" may be calculated as A=B−(N−1)*D*sin(θ).

When the points 416 are uniformly distributed (i.e., the same distance separates each point 416 from the adjacent points 416 when projected onto the subject), then A=C=D*sin(θ) and tan(θ)=K/N.

Using one or more of these relationships, the angle θ can be calculated to achieve a desired distance between the scan lines 418. For example, when N (the number of rows) is equal to 600 and K=2, then θ=tan⁻¹(2/600)≈0.19098 degrees.

Figure 6:
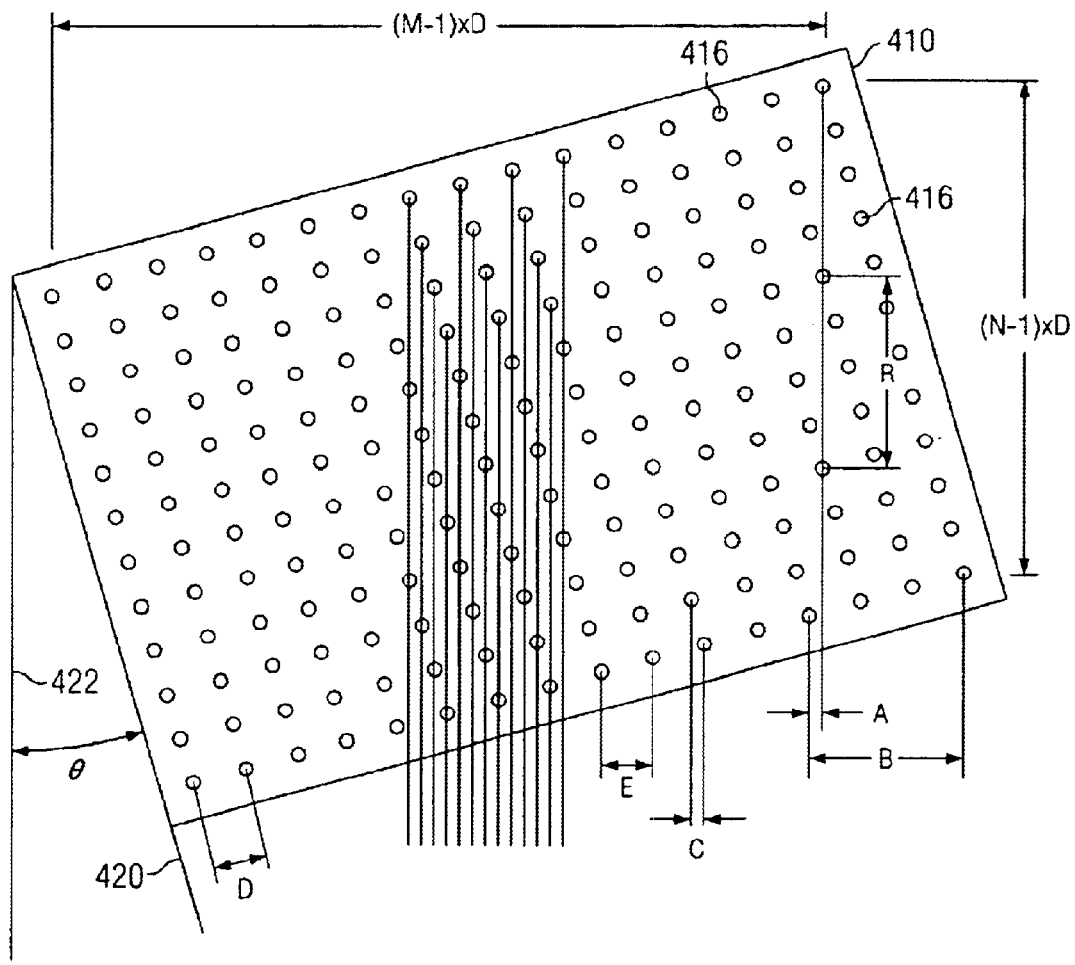
FIG. 6 illustrates the point array of FIG. 5 rotated so that three points fall on a single vertical line.

Referring now to FIG. 6, the point array 410 of FIG. 5 is illustrated with a larger angle θ. In contrast to FIG. 5, the present figure depicts an example where K=3. This means that there is redundancy such that three points 416 from the array 410 fall on the same scan line 418 (i.e., there is a three to one correspondence between three points 416 and a scan line 418). For example, the points (8,1), (7,5), and (6,9) are associated with the same scan line 418.

The distance "D" separates each point 416 from the adjacent points 416. As in FIG. 5, the total distance between the first and last points 416 in each row is equal to (M−1)*D, while the total distance between the first and last points 416 in each column is (N−1)*D. Using M, N, K, D and θ, a series of relationships may be developed for K=3. As in FIG. 5, the relationships enable various aspects of the rotation of the array 410 to be calculated in order to achieve a desired result.

The distance "B" designates the distance between the scan lines 418 of two points in a row separated by two other points 416 when the array 410 is rotated to angle θ. For example, the point (13,12) is separated from the point (16,12) by the distance B, which may be calculated as B=K*D*cos(θ). The distance "C" may be calculated as C=D*sin(θ). The distance "A" may be calculated as A=B−(N−1)*D*sin(θ). A distance "R" represents the distance between redundant points 416 on a scan line 418. For example, the point (15,5) is separated from the point (14,9) by the distance R. A distance "E" designates the distance between the scan lines 418 of two adjacent points in a row when the array 410 is rotated to angle θ, and may be calculated as E=C*N/K.

When the points 416 are uniformly distributed (i.e., the same distance separates each point 416 from the adjacent points 416 when projected onto the subject), then A=C=D*sin(θ), N/K is an integer, and tan(θ)=K/N.

Additional relationships may be developed using the above described equations.

$$\cos(\theta)^2 = N^2/(N^2+K^2)$$

$$\sin(\theta)^2 = K^2/(N^2+K^2)$$

$$R/C = 1+(N/K)^2$$

$$R = C*(1+(N/K)^2)$$

Using one or more of these relationships, the angle θ can be calculated to achieve a desired distance between the scan lines 418. For example, when N (the number of rows) is equal to 600 and K=3, then θ=tan⁻¹(3/600)≈0.286 degrees.

Angles for different relationships may be calculated by applying the above described equations. For example, if N=600 and K=20, then N/K=30, which is an integer. Therefore, there is a uniform distribution of points on the substrate surface and the angle θ may be calculated from tan(θ)=K/N. In this instance, θ≈1.91 degrees.

Figure 7:
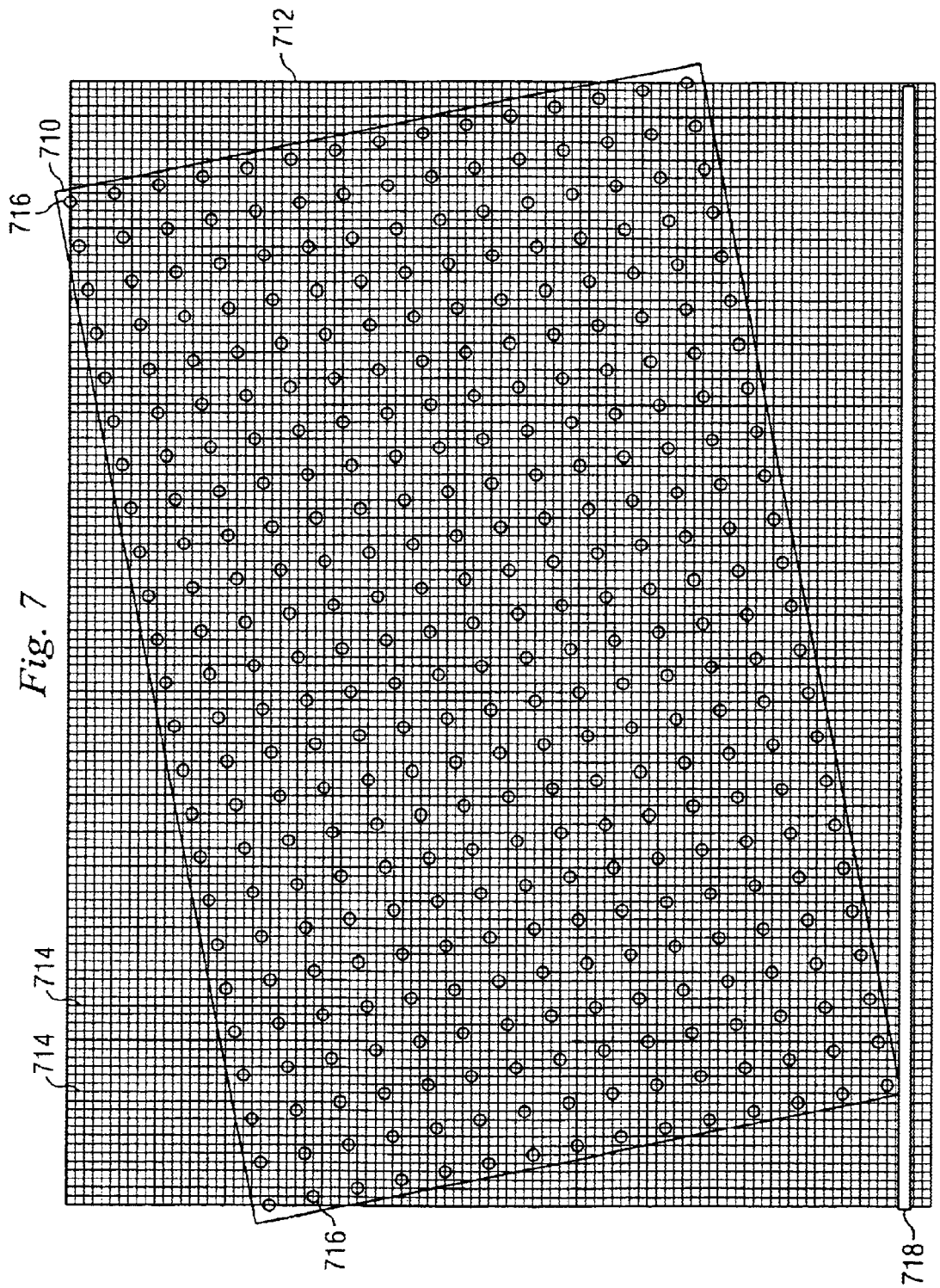
FIG. 7 illustrates a point array overlaid on an exemplary memory grid.

Referring now to FIG. 7, in one embodiment, a point array 710 (such as is embodied by a rotated DMD) is illustrated as an overlay on a memory 712 (shown as an exemplary memory grid). The point array 710 comprises M columns and N rows, where M=24 and N=15. For purposes of illustration, the memory 712 comprises an S column by T row grid 718 of memory locations 714. The memory 712 may be contiguous (as illustrated) or non-contiguous.

The memory 712 includes an image (not shown) such as may be used for a photolithographic mask. Therefore, portions of the image are located at appropriate S,T locations 714 in the memory 712. Individual points 716 of the array 710 are illustrated overlaying memory locations 714 so as to reflect the rotation of the array 710 (i.e., located in such a way that each point 716 can be identified by a set of S,T coordinates). The rotation of the array 710 is such that K=3, which means that three points 714 from the array 710 are in the same memory column S.

The size of the memory grid 712 is 130×94, which may be calculated as follows:

$$S=N+(M-1)*N/K=15+(24-1)*15/3=130$$

$$T=M+(N-1)*N/K=24+(15-1)*15/3=94.$$

Image data for the point array 710 may be retrieved memory row T by memory row T from the memory 712 and projected onto a subject (not shown). It is noted that a memory row T may not be equivalent to a point array row N, as the point array 710 has been rotated. As each memory row T is retrieved, a pointer 718 representing a starting address for the retrieved memory row T is updated to the address for the next memory row T to be retrieved. It is apparent that alternate retrieval strategies may be implemented to achieve the same result. For example, it may be preferable to retrieve multiple rows simultaneously, or it may be advantageous to retrieve the point array from memory on a column by column basis.

The point array 710 with its respective points 716, as illustrated in FIG. 7, may be viewed as a single "frame" in a scanning process. Each point 716 would then represent a corresponding pixel in the image stored in the underlying memory location 714. Therefore, each memory location 714 would appear in its respective position when the frame is projected onto a subject. This process is described in further detail with respect to FIG. 8.

Figure 8:
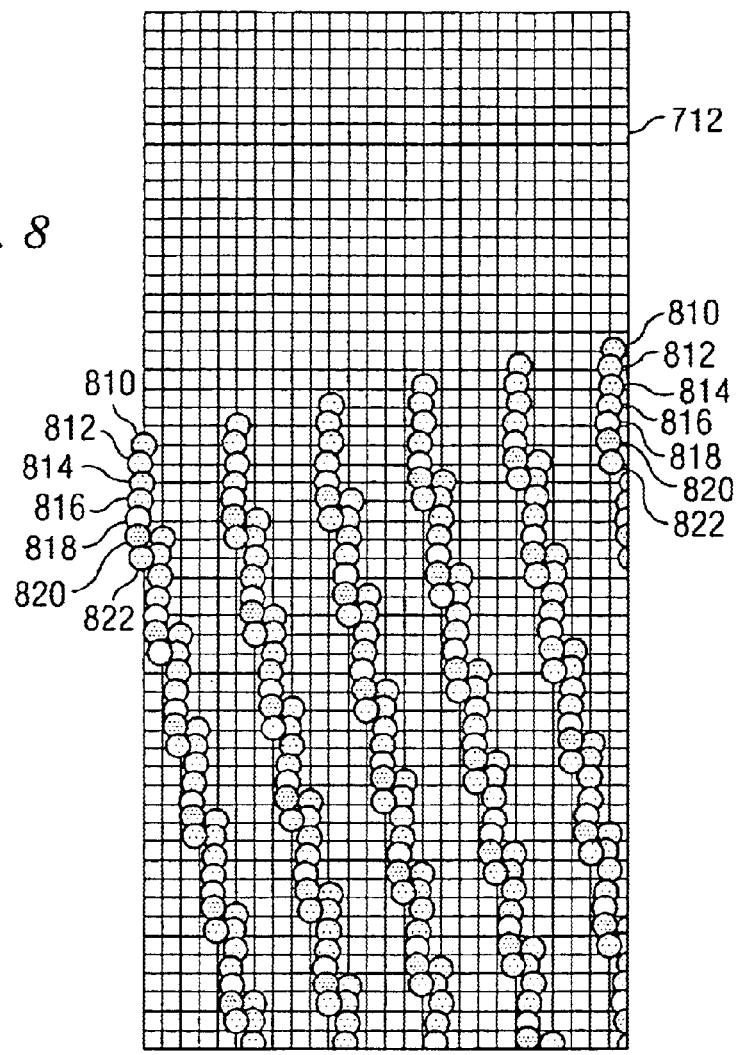
FIG. 8 is an exploded view of a portion of the point array of FIG. 7 illustrating individual points in a series of frames.

Referring now to FIG. 8, an exploded view of a portion of the point array 710 overlay of FIG. 7 is now illustrated. The view illustrates an exemplary frame sequence for the point array 710. The points 716 of point array 710 are illustrated as a series of frames 810–822. Although the exploded view does not show each point 716, the frames 810–822 each include a set of 24×15 points 716 having a similar shading. Therefore, FIG. 8 illustrates seven frames 810–822. Each frame 810–822 includes the points 716, but the location of the points relative to the underlying image is altered as the point array 710 is scanned. For example, the frame 810 includes the topmost set of points in each group of seven, while the frame 812 includes the second set of points, and so on.

Figure 9:
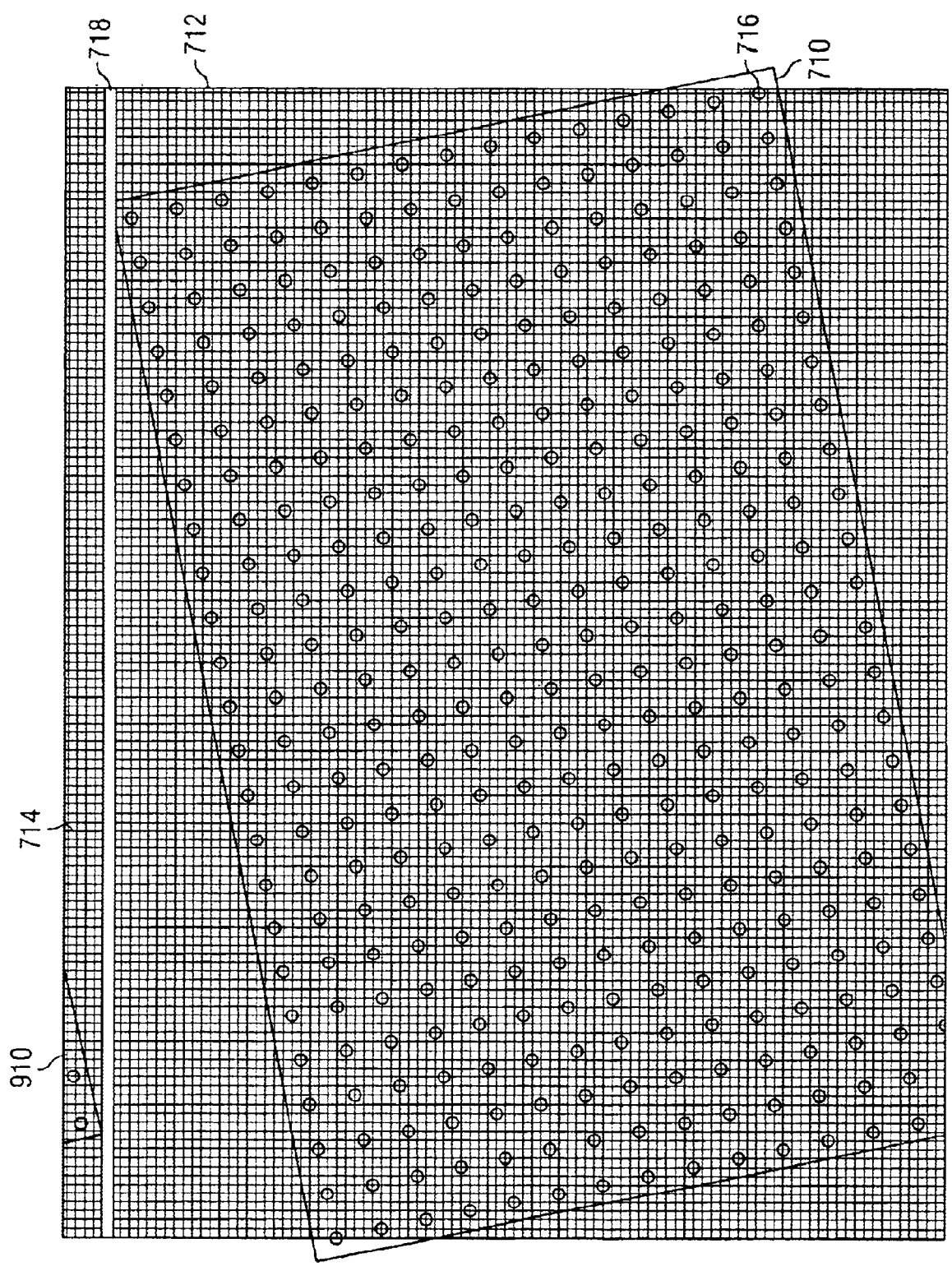
FIG. 9 illustrates the point array of FIG. 7, with a portion of a second point array overlay visible.

Referring now to FIG. 9, a final row of memory overlaid by the array 710 of FIG. 7 is illustrated as the current address of the pointer 718. A portion of memory for a second array 910 is visible and will be retrieved next starting with the bottom row. It is noted that a single point array may utilize a large amount of memory, and multiple arrays utilize increasingly large amounts of memory. In addition, a high rate of retrieval may be maintained for optimal projection results.

Figure 10A:
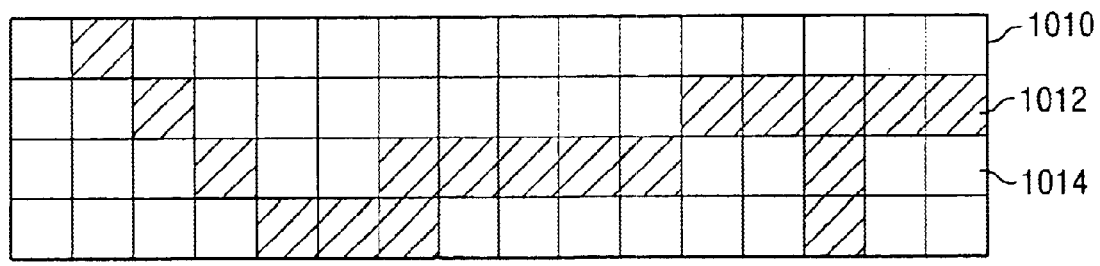
FIG. 10 is an example of an image portion projected at two different resolutions.
Figure 10B:
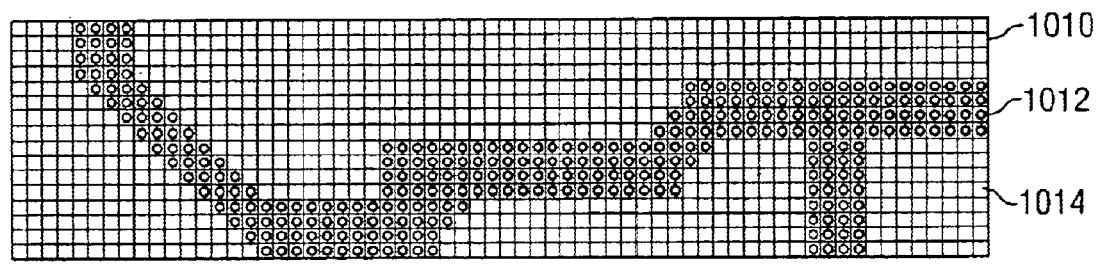

Referring now to FIGS. 10a–b, an example of a benefit afforded by the higher resolution provided by the present invention is illustrated. Referring now specifically to FIG. 10a, a pixel panel (not shown) is operable to project a point array 1010 at a resolution of 3.4 micrometers (μm). The point array includes "full" pixels 1012 which may represent pixels for circuit components and "empty" pixels 1014 which represent empty space in which no circuit component is present. This may be accomplished with a frame rate of approximately 5000 frames per second (5 Kfps) at a data rate of approximately 450 KB per pixel panel. As previously described, the resolution of the projected image is typically limited by the resolution of the pixel panel.

Referring now specifically to FIG. 10b, rotating the pixel panel such that K=30 enables the same portion of the point array 1010 to be projected at a higher resolution of 0.85 μm. Therefore, in the present example, rotating the point array 1010 provides a level of resolution that is four times greater than the native resolution of the pixel panel. This means that each pixel 1012, 1014 of FIG. 10a is now represented by sixteen pixels in FIG. 10b. This may allow edges to be smoothed and similar desirable refinements to be made to the circuit.

Figure 11:
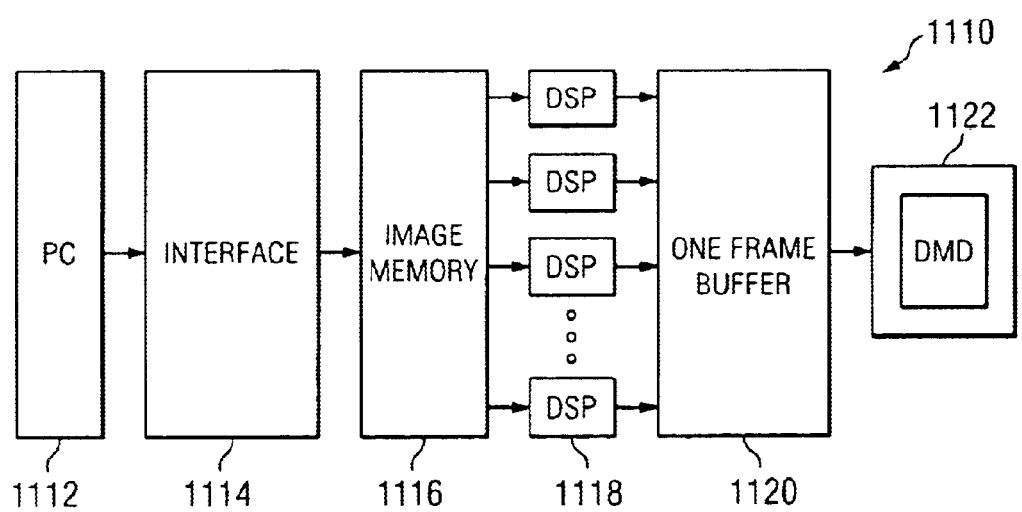
FIG. 11 is a diagrammatic view of one embodiment of an exemplary system for converting image data for display on a rotated pixel panel.

Referring now to FIG. 11, one embodiment of a system 1110 for real time data extraction and manipulation is illustrated. The system 1110 may be incorporated in another system, such as the system 100 of FIG. 1, or it may be a stand alone system. In the present embodiment, the system 1110 includes a personal computer (PC) 1112, an interface 1114, an image memory 1116, a plurality of digital signal processing (DSP) devices 1118, a frame buffer 1120, and a DMD 1122. The PC, utilizing the interface 1114, may interact with and/or control aspects of the system 1110.

For purposes of illustration, the system 1110 utilizes point arrays 1124 (not shown) of M=848 columns and N=600 rows, such as are described in relation to FIGS. 4–9. The point arrays 1124 may be combined to form an image 1126 (not shown), and so each point array 1124 may be viewed as a single frame of the image 1126. Each point array 1124 includes a plurality of points 1128. Each DSP device 1118 operates in a similar manner, and so a single exemplary DSP device 1118 is described below. In the present embodiment, the DMD 1122 is rotated so that K=30, as has been previously described and has a native resolution of 848 pixels by 600 pixels.

The memory size needed to store an 848×600 point array (a frame) may be calculated by inserting the values for M, N, and K into the previously described equations. Doing so results in a memory size of:

$$S=N+(M-1)*N/K=600+(848-1)*600/30=17540$$

$$T=M+(N-1)*N/K=848+(600-1)*600/30=12828$$

or 17540×12828. This can be viewed in terms of storage as approximately twenty-eight megabytes (MB).

In operation, the DSP device 1118 extracts a discrete unit, such as a frame embodied in one of the point arrays 1124, from the image 1126. The DSP device 1118 then calculates a position on the DMD 1122 for each point 1128 of the point array 1124. Because the DMD 1122 is rotated in relation to a subject 1130 (not shown), the position of each point 1128 enables proper projection of the associated point array 1126.

After the DSP device 1118 has calculated the DMD positions of the points 1128, the frame is transferred to the frame buffer 1120. In the current embodiment, the frame buffer 1120 is capable of storing a single 848×600 frame, which is approximately 62.1 kilobytes (KB) of data. The frame buffer 1120 then transfers the frame to the DMD 1122, where the frame is projected onto a subject. It is noted that a plurality of frame buffers 1120 may be utilized for increased efficiency and throughput. For example, dual frame buffers 1120 may be utilized so that, while one frame buffer is receiving data from the DSP device 1118, the other frame buffer is transferring its data to the DMD 1122.

Figure 12:
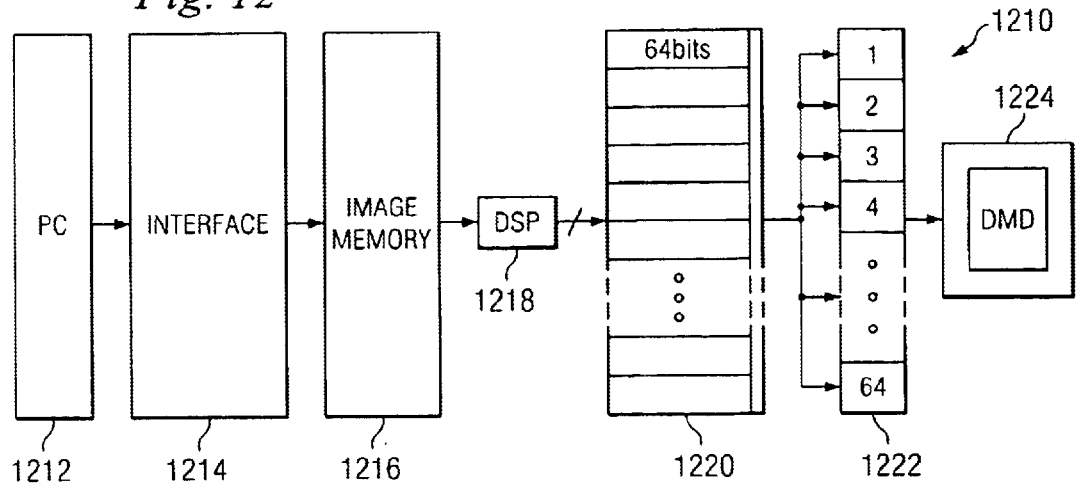
FIG. 12 is a diagrammatic view of another embodiment of an exemplary system for converting image data for display on a rotated pixel panel.

Referring now to FIG. 12, another embodiment of a system 1210 for real time data extraction is illustrated. The system 1210 may be incorporated in another system, such as the system 100 of FIG. 1, or it may be a stand alone system. In the present embodiment, the system 1210 includes a PC 1212, an interface 1214, an image memory 1216, a DSP device 1218, a shift register 1220, a frame buffer 1222, and a DMD 1224.

The PC, utilizing the interface 1214, may interact with and/or control aspects of the system 1210. The shift register 1220 may be a single shift register or may be a plurality of shift registers suitable for a desired operation. For purposes of illustration, the shift register 1220 is a 64×53 bit register (i.e., it includes 53 registers operable to store 64 bits each). The DMD 1224 in the system 1210 includes a 53 bit data path, although other data path sizes may be used as desired, and has a native resolution of 848×600. The frame buffer 1222 includes a capacity for sixty-four 848×600 frames.

As in FIG. 11, the system 1210 utilizes point arrays 1226 (not shown) of M=848 columns and N=600 rows. The point arrays 1226 may be combined to form an image 1228 (not shown), and so each point array 1226 may be viewed as a single frame of the image 1228. Each point array 1226 includes a plurality of points 1230. In the present embodiment, the DMD 1224 is rotated so that K=30, as has been previously described.

The memory size needed to store an 848×600 point array (a frame) may be calculated by inserting the values for M, N, and K into the previously described equations. Doing so results in a memory size of:

$$S=N+(M-1)*N/K=600+(848-1)*600/30=17540$$

$$T=M+(N-1)*N/K=848+(600-1)*600/30=12828$$

or 17540×12828. This can be viewed in terms of storage as approximately 28 megabytes (MB).

In the present embodiment, the DSP device 1218 selects and extracts 64 bits of data from the memory 1216. The selection and extraction of data may be done by row or column, or by some other method. The DSP device 1218 then calculates the location for each of the 64 bits on the DMD 1224, and transfers the data into one of the 64 bit registers of the shift register 1220. The DSP device 1218 continues with this selection, extraction, calculation, and transfer process until all 53 of the 64 bit registers of the shift register 1220 are full.

The contents of the shift register 1220 are then transferred to the frame buffer 1222. Since each of the 64 frames included in the frame buffer 1222 is 848×600, the contents of the shift register 1220 may not be sufficient to fill a frame. Therefore, the process involving the DSP device 1216, the shift register 1220, and the frame buffer 1222 may be repeated until each frame of the frame buffer 1222 is filled. After 64 frames (or less, if 64 frames are not available) are stored in the frame buffer 1222, the frames are transferred to the DMD 1224 and projected onto a subject. The process then begins again in order to retrieve more data for the DMD 1224 as is illustrated in FIG. 13.

Figure 13:
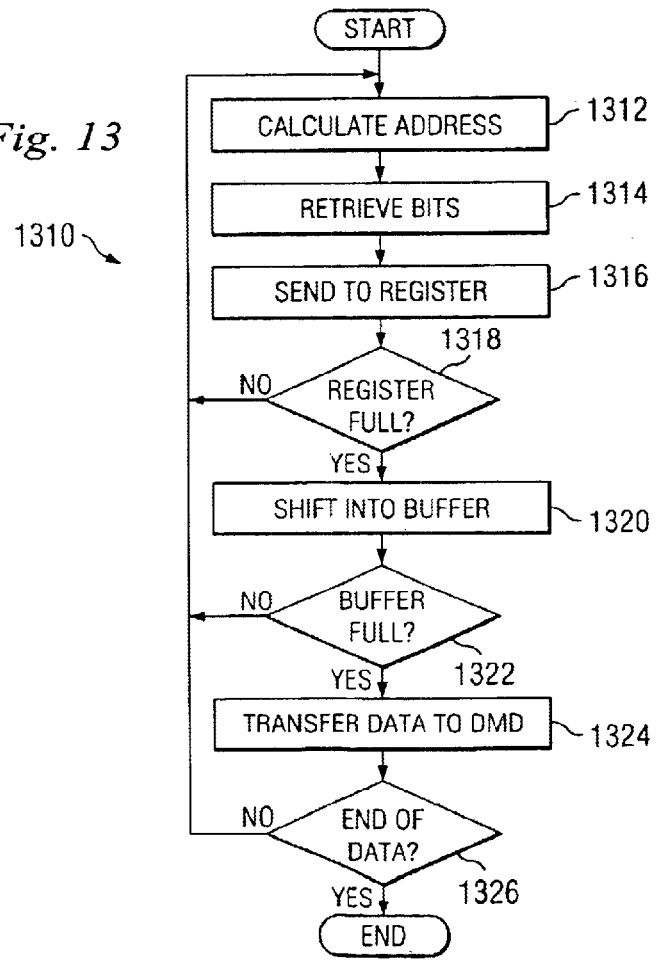
FIG. 13 is a flow chart illustrating a process for retrieving image data from memory and projecting it on a rotated pixel panel.

Referring now to FIG. 13, a method 1310 suitable for application to the system 1210 of FIG. 12 is illustrated. In step 1312, the method calculates an address for 64 bits, which determines the location of each bit on the DMD 1224. The 64 bits are then retrieved from the memory 1216 in step 1314 and sent to the register 1220 in step 1316. Once this process occurs 53 times, as determined in step 1318, the data is shifted into the frame buffer by column (i.e., 53 bits at a time) in step 1320. For example, the most significant digit (or least, depending on the endian ordering) of all 53 registers are shifted in the first frame, while the second most (or least) significant digits of all 53 registers are shifted into the second frame and so on, until all 64 bits have been shifted into an appropriate frame. Therefore, a total of 64 shifts will be utilized to fully clear the shift register 1220.

If the frames of the frame buffer 1222 are not full as determined in step 1322, the process returns to step 1312. This continues until the frames are full or until all the data has been transferred from the memory 1216. When the frames are full, the data is transferred for each frame in sequential order to the DMD 1224 in step 1324. If image data remains to be transferred as determined in step 1326, the process returns to step 1312. It is noted that the ordering of some steps of the method 1310 may be altered and that certain steps may be modified or removed. For example, it may be preferable to retrieve the 64 bits from the memory before calculating the addresses. In addition, it may be preferable to calculate a single address for each retrieved set of bits, rather than for each bit. These and other alterations may depend on a particular implementation of the system 1210, and so the described system and method are merely exemplary.

Referring again to FIG. 12, it is noted that a plurality of frame buffers 1222 may be utilized for increased efficiency and throughput. For example, dual frame buffers 1222 may be utilized so that, while one frame buffer is receiving data from the shift register 1220, the other frame buffer is transferring its data to the DMD 1224. The system 1210 utilizes a relatively small amount of memory, but certain steps may be repeated in order to retrieve all of the frames.

Figure 14:
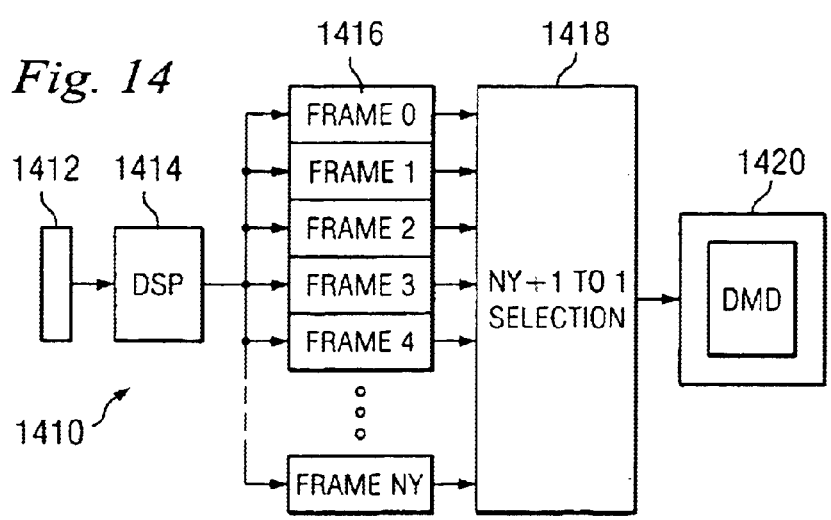
FIG. 14 is a diagrammatic view of yet another embodiment of an exemplary system for converting image data for display on a rotated pixel panel.

Referring now to FIG. 14, yet another embodiment of a system 1410 for real time data extraction is illustrated. The system 1410 may be incorporated in another system, such as the system 100 of FIG. 1, or it may be a stand alone system. In the present embodiment, the system 1410 includes a line buffer 1412, a DSP device 1414, a frame buffer 1416, a selector 1418, and a DMD 1420. The DMD 1420 in the system 1410 includes a 53 bit data path, although other data path sizes may be used as desired, and has a native resolution of 848×600. The frame buffer 1416 is operable to hold a plurality of 848×600 frames for an image 1422 (not shown).

As in FIG. 11, the system 1410 utilizes point arrays 1424 (not shown) of M=848 columns and N=600 rows. The point arrays 1424 may be combined to form the image 1422 (not shown), and so each point array 1424 may be viewed as a single frame of the image 1422. Each point array 1424 includes a plurality of points 1426. In the present embodiment, the DMD 1420 is rotated so that K=30, as has been previously described.

In the present embodiment, the line buffer 1412 receives lines of data from a memory (not shown). For example, the line may be a row of memory such was described in relation to FIG. 7. The data line is retrieved from the line buffer 1412 by the DSP device 1420. The DSP device 1414 calculates the address for the line data so that its location on the DMD 1420 is known. The DSP device 1414 then transfers the line data into the frame buffer 1416. This process continues until all the line data has been placed into the appropriate frames. Therefore, the frame buffer 1416 includes a total number of frames for the image 1422.

After the line data is stored in the frame buffer 1416, the selector 1418 selects a frame and transfers the selected frame to the DMD 1420 for projection. This selection may be sequential or may use some other criteria for the order in which frames are selected and transferred.

It is noted that modifications to the system 1410 may be made as desired. For example, it may be desirable for the selector to transfer frames as they are filled, rather than waiting for the frame buffer 1416 to completely fill before beginning the selection and transfer process. In addition, the DSP device 1414 may insert the line data into the frames in a variety of ways. For example, the DSP device 1414 may insert the entire line into a single frame, or it may insert individual bits of the line data into appropriate but different frames.

The system 1410 may utilize more memory than some systems (for example, the system 1210 if FIG. 12), but is operable to prepare all the frames of an image for transfer at one time. Therefore, different systems may be used to accomplish different goals. In addition, systems or portions of systems may be combined so as to gain particular benefits as desired.

It is noted that memory usage may be effected by the value selected for K. As is illustrated below, a smaller K generally results in higher memory consumption, while a higher K results in a lower memory consumption.

For example, a point array of 848×600 with K=30 may have a memory array of 17540×12828, as calculated previously. A line buffer operable to buffer a complete line of data will need memory for 17540 bits, or approximately 3.3 KB. A frame buffer operable to hold all the frames may have a memory allowance for 12828×848×600 bits, or 816 MB.

In contrast, the same point array of 848×600, but with K=20, may have a memory array of 26010×18818. A line buffer operable to buffer a complete line of data will need memory for 26010 bits, or approximately 3.3 KB. A frame buffer operable to hold all the frames may have a memory allowance for 18818×848×600 bits, or 1.2 gigabytes (GB).

Figure 15:
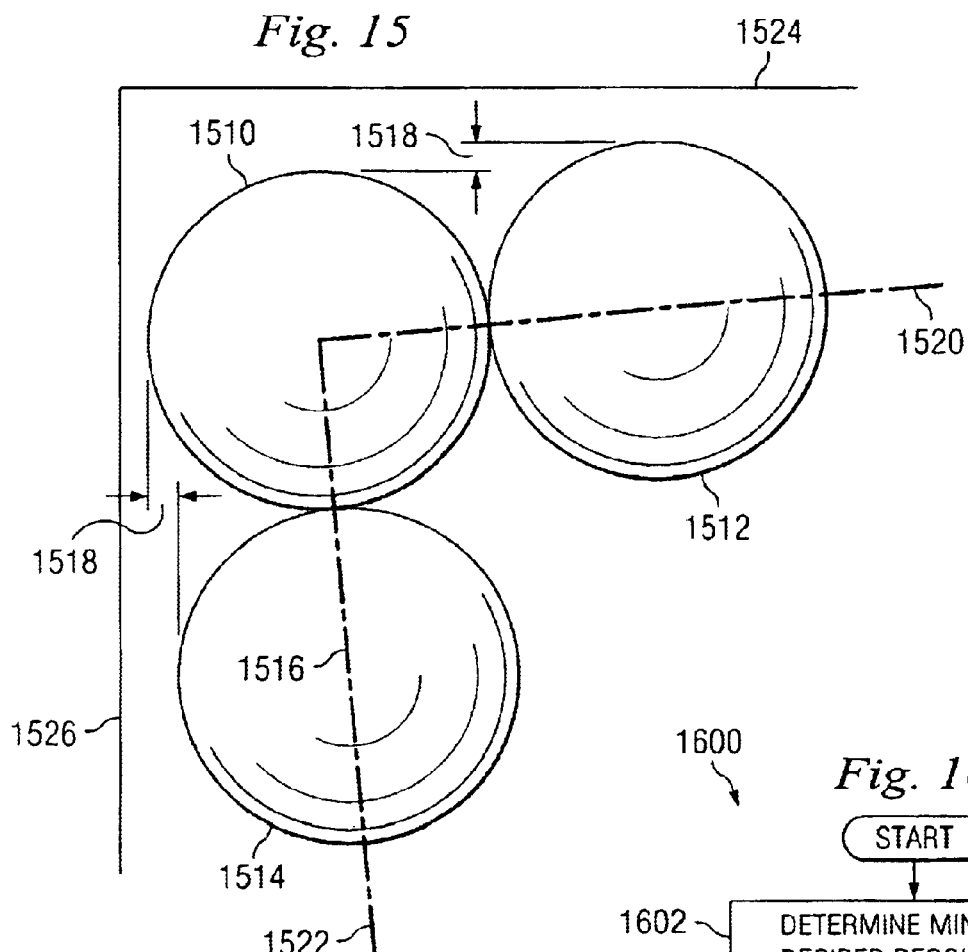
FIG. 15 illustrates three pixels that have been rotated relative to a subject to create an offset.

Referring now to FIG. 15, in another embodiment, high resolutions may slow scanning speeds undesirably in some applications. This negative impact on speed may be caused in part by the size of the unit travel length, which is represented in FIG. 6 and the associated text by the distance "C". A DMD (not shown) may receive a frame update for each unit travel length as described above in reference to FIGS. 11, 12, and 14. Therefore, a relatively small unit travel length may result in a large number of DMD updates, which in turn may negatively impact the scan speed because the DMD frame rate is fixed.

To increase the scan rate, it may be desirable to alter the unit travel length. However, while altering the unit travel length increases the scanning speed and may remove a certain amount of the redundancy previously represented by "K", it may decrease the resolution to an undesirable level.

As illustrated in FIG. 15, a particular resolution may be achieved without the need for a particular line width. Consider three pixels 1510–1514, each having a diameter 1516 that may be relatively large in comparison to a desired resolution defined by a distance 1518. For example, the diameter 1516 may be 2.2 $\mu$m while the desired resolution 1518 may be 0.2 $\mu$m. Assuming that the line width of 2.2 $\mu$m is acceptable for an intended application, there is no need for an actual line width of 0.2 $\mu$m to achieve the desired resolution of 0.2 $\mu$m. This may be beneficial because achieving a particularly narrow line width, as described above, can slow the scan speed to undesirable levels.

The resolution of 0.2 $\mu$m may be realized by providing an offset distance (e.g., the distance 1518). The offset distance may be provided by rotating the pixels 1510–1514 in relation to a subject (not shown). For example, the rotation may be accomplished by rotating an x-axis 1520 and y-axis 1522 (fixed on the pixels 1510–1514) relative to an x-axis 1524 and y-axis 1526 defining the subject. By defining the unit travel length as the spacing of the pixels 1510–1514, rather than the distance 1518, the unit travel length may be increased from 0.2 $\mu$m to 2.2 $\mu$m. As described below in greater detail, this increase achieves the resolution of 0.2 $\mu$m while also maintaining a relatively high scan rate.

Figure 16:
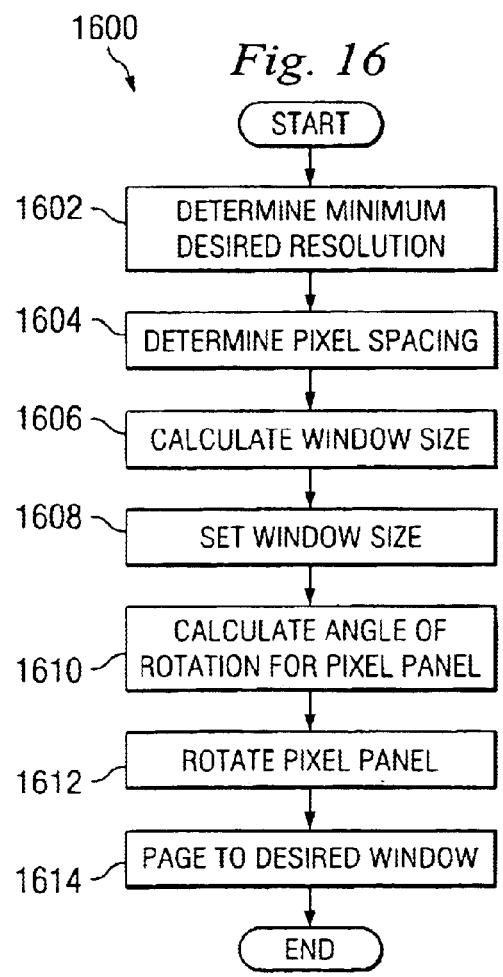
FIG. 16 is a flow chart illustrating a process for creating windows using the rotation illustrated in FIG. 15 and selecting one of the windows for projection onto the subject.

Referring now to FIG. 16, a method 1600 utilizes the pixel panel rotation, pixel offset, and increased unit travel length described above to increase a scan rate while maintaining a desired minimum resolution. The minimum resolution and a pixel spacing are determined in steps 1602 and 1604. In 1606, a window size is calculated using the minimum resolution and pixel spacing. The window size is set in step 1608 based on the calculation of step 1606. An angle of rotation θ for a pixel panel is calculated in step 1610 as described previously and the pixel panel is rotated to that angle in step 1612. The desired window may then be paged in step 1614 to position a pixel at a desired location for projection onto a subject. The method 1600 may be accomplished as described in reference to FIG. 17.

Figure 17:
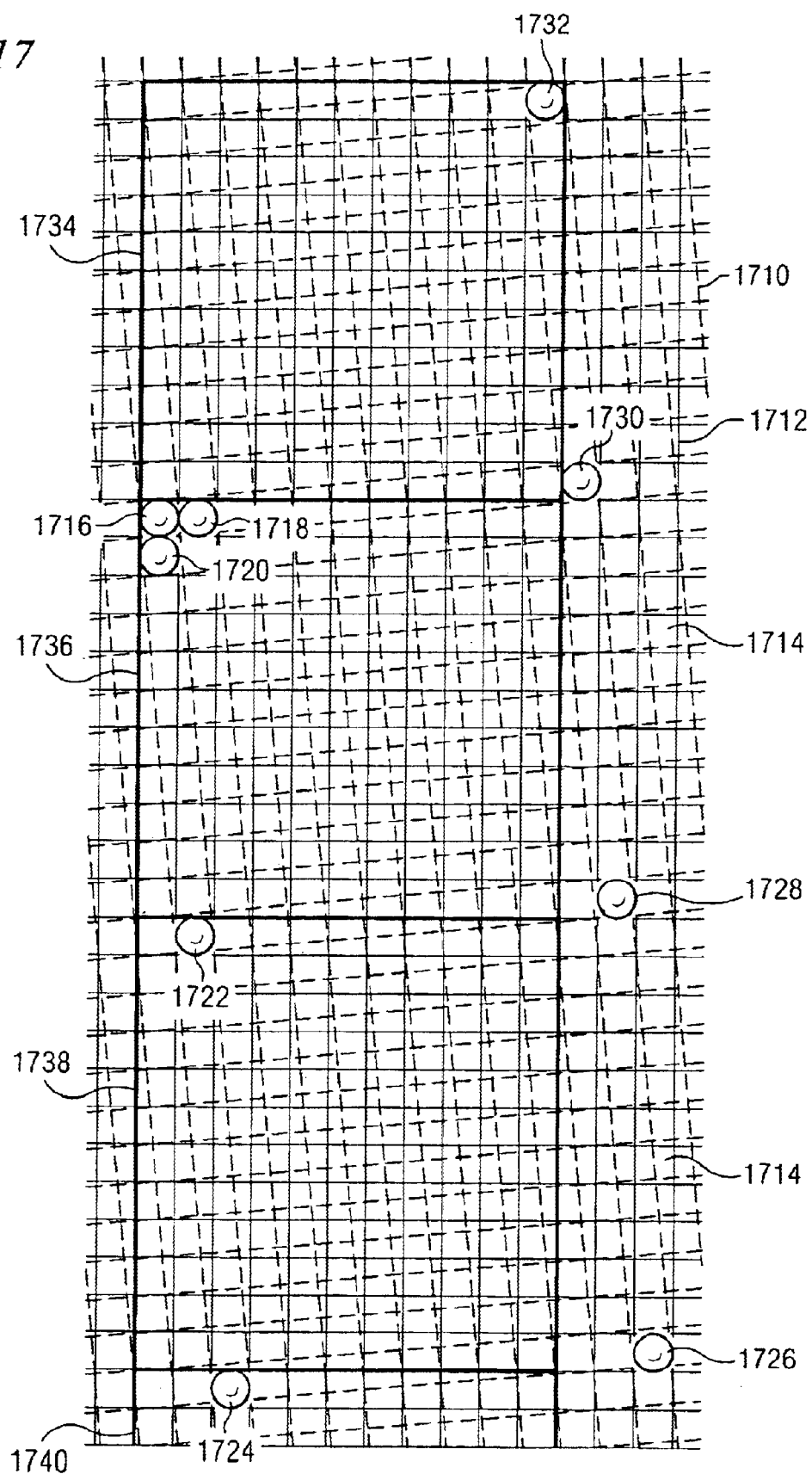
FIG. 17 illustrates a plurality of windows overlaid on a point array and memory grid.

Referring now to FIG. 17, a point array 1710 (such as may be embodied by a rotated DMD) is illustrated as an overlay on a design grid 1712 (which may be a memory as previously described). In the present example, the design grid 1712 comprises a grid of 2.2 $\mu$m squares and a desired resolution of 0.2 $\mu$m is to be achieved. The design grid 1712 may include data points (e.g., pixels) 1716–1732 in one or more of locations 1714. The pixels 1716–1720 are arranged in a manner similar to the pixels 1510–1514 of FIG. 15.

Portions of the design grid 1712 are illustrated as "windows" 1734–1740. The size of a single window is calculated based on the pixel spacing (e.g., 2.2 $\mu$m) and the minimum desired resolution (e.g., 0.2 $\mu$m), which results in a window size of 2.2 $\mu$m/0.2 $\mu$m=11. Accordingly, each window is 11×11 pixels, with each pixel representing a 2.2 $\mu$m area. As described in reference to FIG. 18 below, the windows 1734–1740 represent every eleventh window.

Figure 18:
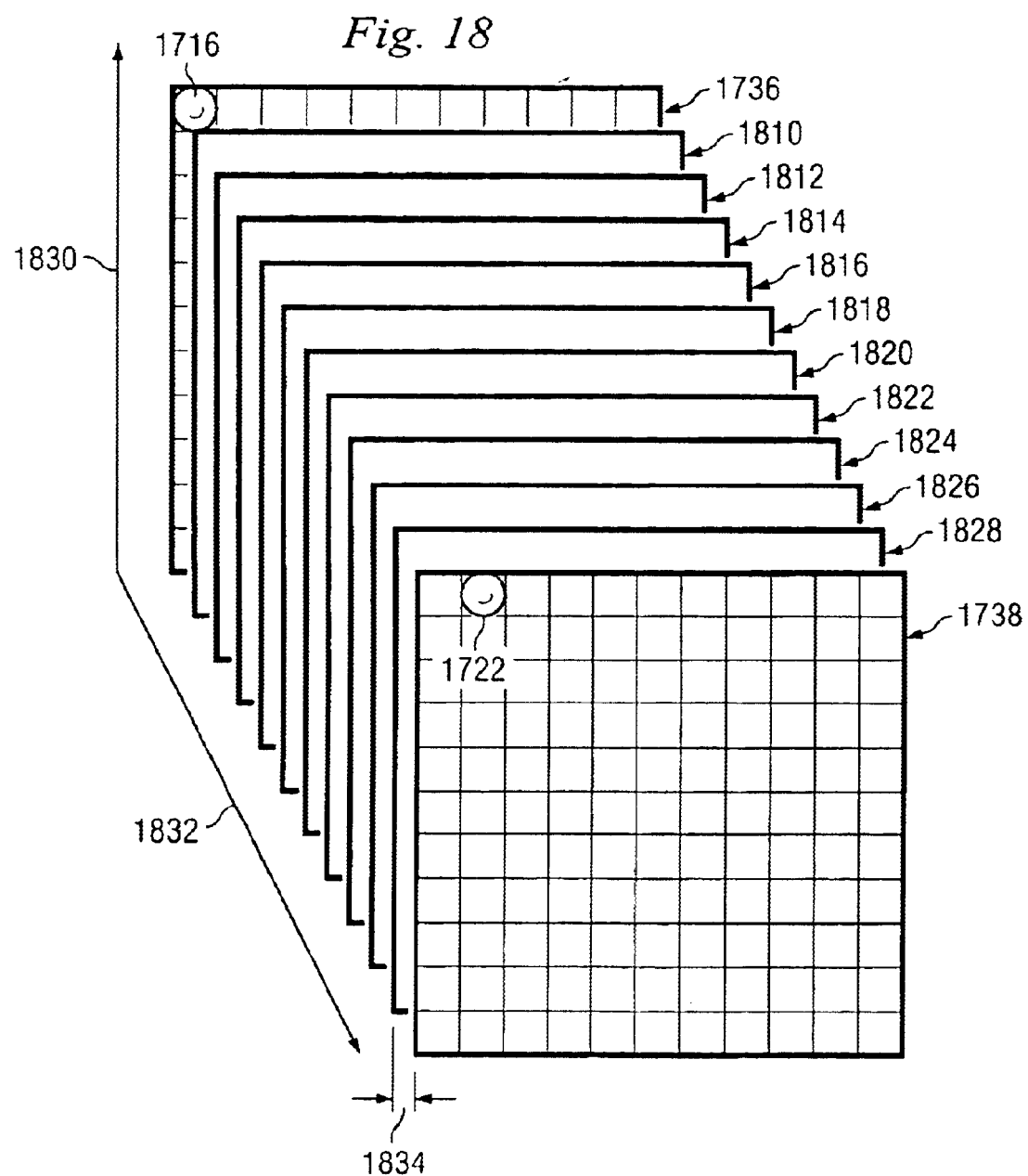
FIG. 18 illustrates some of the windows of FIG. 17 viewed from a different perspective.

Referring now to FIG. 18, the windows 1736 and 1738 are illustrated with a plurality of similar 11×11 pixel intermediate windows 1810–1828. As described previously, each pixel is 2.2 $\mu$m. The windows 1736, 1810–1828, and 1738 are aligned on a y-axis 1830. However, each window is offset from the preceding and succeeding windows in the direction of an x-axis 1832 by a distance 1834, which in the present example is 0.2 $\mu$m. Accordingly, the pixel 1722 in the window 1738 is horizontally offset from pixel 1716 in the window 1736 by 2.2 $\mu$m.

Referring again to FIG. 17, the windows 1734–1740 are projected by the rotated point array 1710. Due to the rotation of the point array 1710, the location of the pixel 1716 may vary incrementally depending on the particular window in which it may be found. For example, the window 1736 includes the three points 1716–1720. Due to the rotation of the point array 1710, the points 1716–1720 are positioned so that there exists a 0.2 $\mu$m offset between each pixel in a single column of the windows 1734–1740 as described previously in reference to FIG. 15.

Therefore, each pixel in one of the windows 1734–1740 is offset by 0.2 $\mu$m in the succeeding window when the rotated pixel panel projects the pixels. Accordingly, a pixel will be completely shifted by 2.2 µm in every eleventh window.

Referring still to FIG. 17, the unit travel length of the pixel panel 1710 may be set at 2.2 µm, while allowing for a minimum resolution of 0.2 µm. Accordingly, a shift of 0.2 µm in the positive x direction may be accomplished by paging forward one page. Likewise, a shift of 0.4 µm may be accomplished by paging forward two pages. Similar incremental shifts may be accomplished by paging forward the desired number of pages. A shift of one pixel (e.g., 2.2 µm) may be accomplished by paging forward eleven pages. Therefore, a desired shift may be achieved by paging to a window having a corresponding pixel position.

Figure 19:
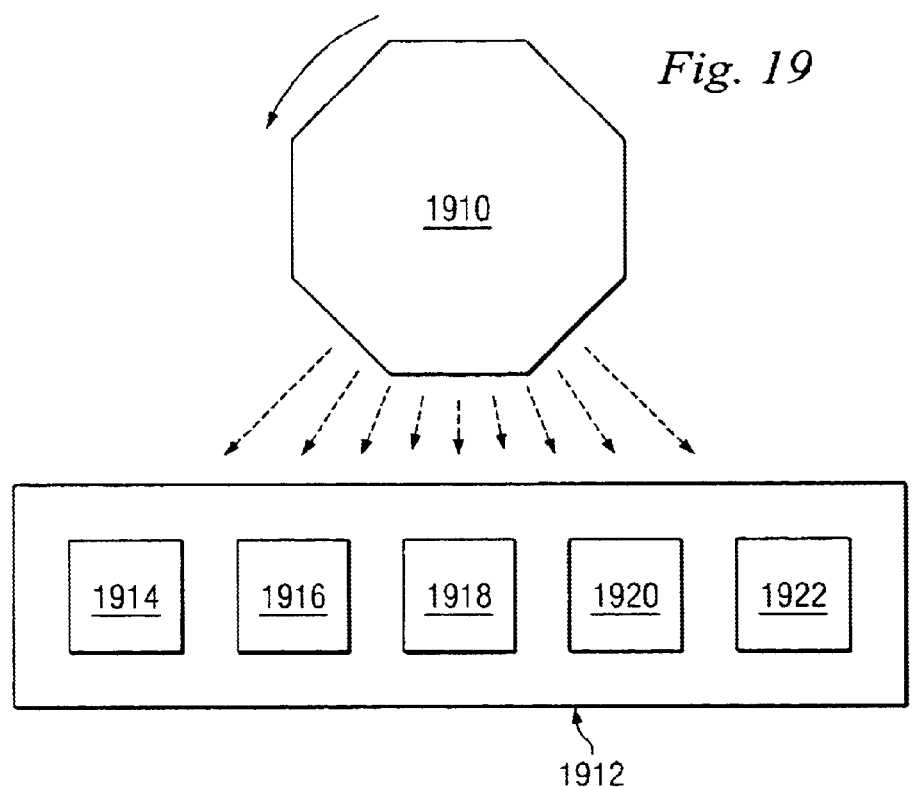
FIG. 19 illustrates an illumination device directing light towards a plurality of exposure areas on a subject.

Referring now to FIG. 19, in another embodiment, an illumination device 1910, such as a polygon mirror, may be used to project or reflect light towards a subject 1912. In the present example, the subject 1912 includes five exposure areas 1914, 1916, 1918, 1920, and 1922. As the subject 1912 moves relative to the polygon mirror 1910, the polygon mirror 1910 may rotate to reflect light towards one or more of the exposure areas 1914–1922 (e.g., only one of the exposure areas may be a "target" exposure area at any given time). However, the light reflected towards the exposure areas 1914–1922 may be "scattered" and not focused on a particular one of the exposure areas (e.g., the target area). Furthermore, the rotation of the polygon mirror 1910 and the movement of the subject 1912 may be such that one or more exposure areas are not illuminated by the most intense light from the polygon mirror 1910 and so may not be properly exposed.

Figure 20:
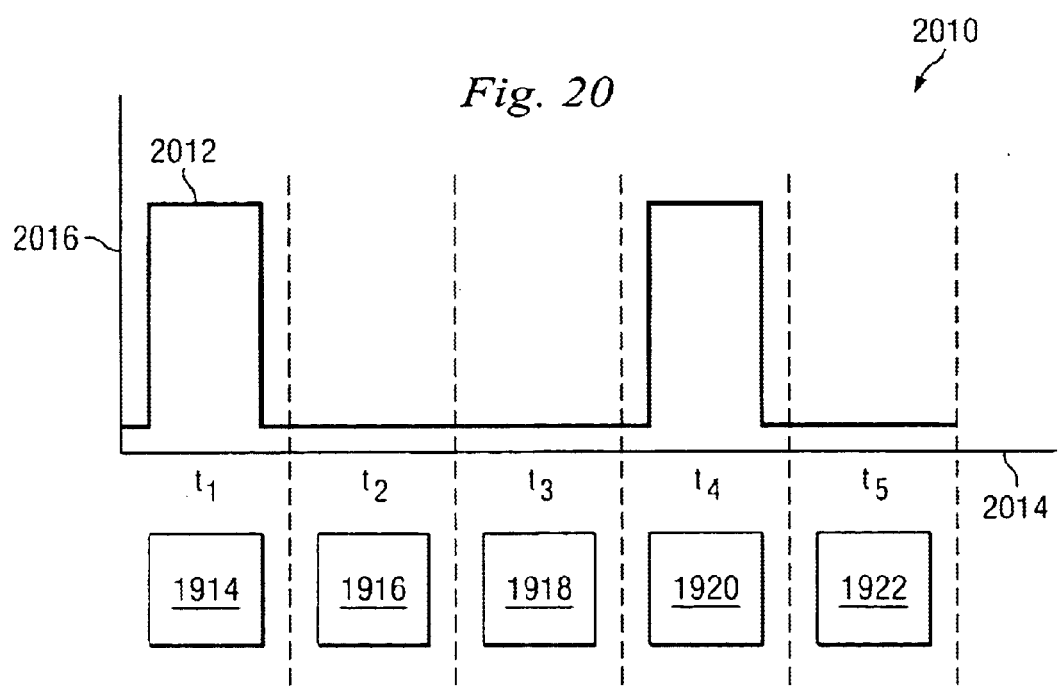
FIG. 20 is a graph illustrating levels of light intensity received by the exposure areas in FIG. 19 over a period of time.

Referring now to FIG. 20, a graph 2010 illustrates a level of light intensity 2012 (reflected by the polygon mirror 1910) in relation to the particular exposure area 1914–1922 being exposed. The graph 2010 includes an x-axis 2014 representing time (divided into five time zones t1–t5) and a y-axis 2016 representing light intensity. It should noted that the upper and lower levels of light intensity may be adjusted as desired. Below the graph are the five exposure areas 1914–1922, which are arranged sequentially in the time zones t1–t5, respectively. In the present example, the light intensity 2012 reaches a maximum at times t1 and t4, and is at a minimum at times t2, t3, and t5. Accordingly, exposure areas 1914 and 1920 receive more intense light than the exposure areas 1916, 1918, and 1922. In the present example, this signifies that the exposure areas 1916, 1918, and 1922 are not fully exposed.

Figure 21:
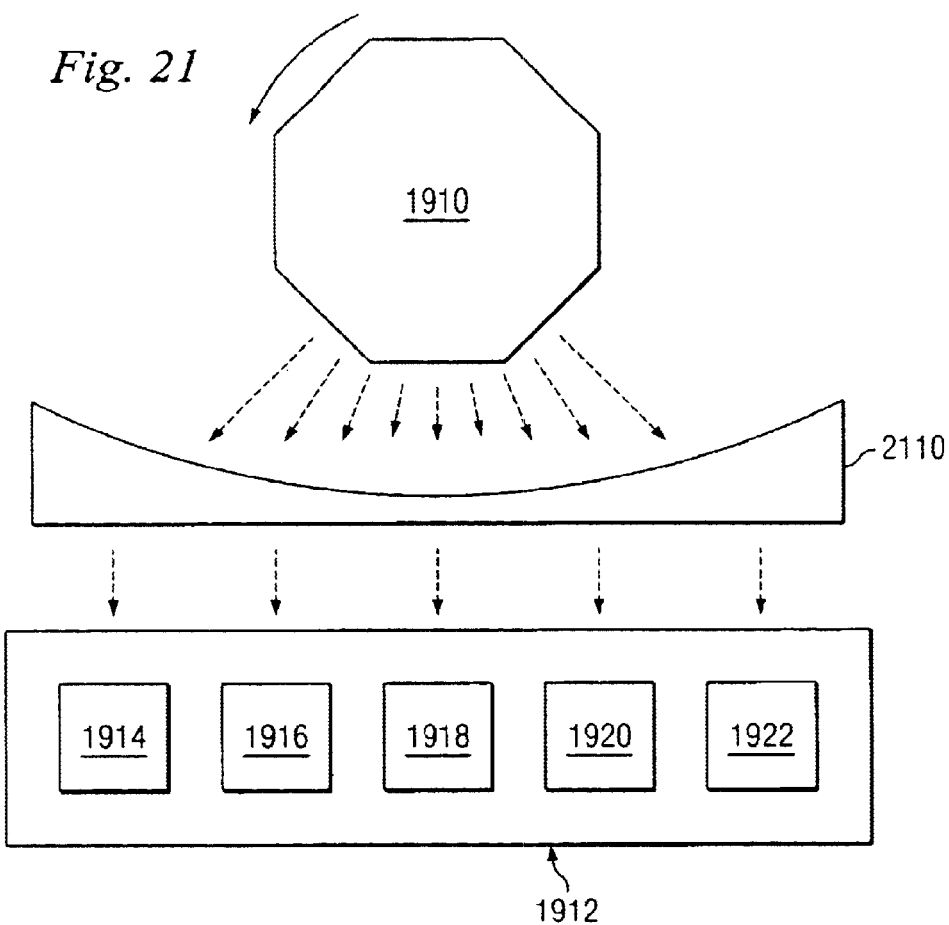
FIG. 21 illustrates the illumination device and exposure areas of FIG. 19 with the addition of a lens.

Referring now to FIG. 21, in still another embodiment, a lens 2110 may be positioned between the polygon mirror 1910 and the subject 1912 of FIG. 19. The lens 2110 may be designed to direct a relatively large portion of the light reflected by the polygon mirror 1910 onto a single one of the exposure areas 1914–1922. As the polygon mirror 1910 rotates and the subject 1912 moves relative to the polygon mirror 1910, the light may be focused onto another of the exposure areas 1914–1922.

Figure 22:
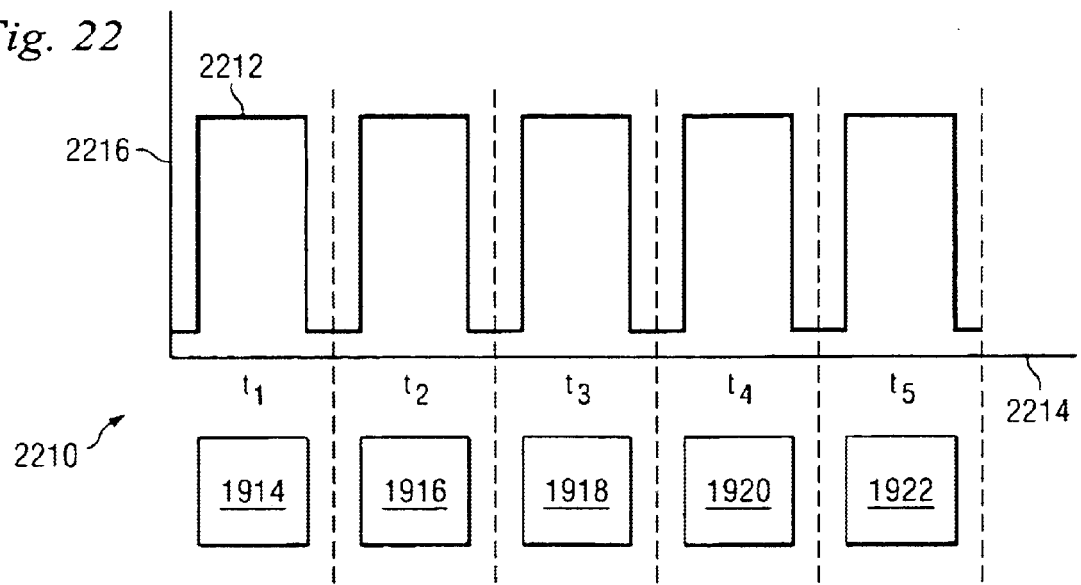
FIG. 22 is a graph illustrating levels of light intensity received by the exposure areas in FIG. 21 over a period of time.

Referring now to FIG. 22, a graph 2210 illustrates a level of light intensity 2212 (reflected by the polygon mirror 1910) in relation to the particular exposure area 1914–1922 being exposed in a manner similar to that of the graph 2010 of FIG. 20. In the present example, unlike that of FIG. 20, the light is directed through the lens 2110 of FIG. 21. The graph 2210 includes an x-axis 2214 representing time (divided into five time zones t1–t5) and a y-axis 2216 representing light intensity. Below the graph are the five exposure areas 1914–1922, which are arranged sequentially in the time zones t1–t5, respectively. In the present example, the light intensity 2212 reaches a maximum in each time zone t1–t5, rather than only during particular time zones. Accordingly, each exposure area 1914–1922 receive a relatively equal amount of light.

While the invention has been particularly shown and described with reference to the preferred embodiment thereof, it will be understood by those skilled in the art that various changes in form and detail may be made therein without departing from the spirit and scope of the invention. Therefore, the claims should be interpreted in a broad manner, consistent with the present invention.

What is claimed is:

1. A method for increasing a scan rate while maintaining a minimum resolution in an optical imaging system, the optical imaging system including a projection device, the method comprising:

determining a minimum resolution and a spacing distance for a first discrete element and a second discrete element;

calculating a window size based on the minimum resolution and the spacing distance and setting a window equal to the calculated size; and calculating an angle of rotation for the projection device relative to a subject based on the window size, the angle of rotation operable to offset the first discrete element from the second discrete element by the minimum resolution.

2. The method of claim 1 further comprising associating the first discrete element with a first window and the second discrete element with a second window.

3. The method of claim 2 further comprising:

identifying a position for each of the first and second discrete elements in their respective windows; and associating each of the first and second discrete elements with their respective position.

4. The method of claim 2 further comprising determining whether to select the first discrete element or the second discrete element for projection onto the subject at a predefined location, wherein the determination includes identifying which of the first and second discrete elements will match the predefined location when projected.

5. The method of claim 4 further comprising selecting the first or second discrete element by paging to the first or second window, respectively.

6. The method of claim 1 further comprising rotating the projection device relative to the subject in accordance with the angle of rotation.

7. The method of claim 1 further comprising:

defining a unit travel length as the spacing distance; and adjusting the scan rate based on the unit travel length.

8. The method of claim 1 wherein calculating the window size based on the minimum resolution and the spacing distance includes calculating a number 'N' by dividing the spacing distance by the minimum resolution, wherein the window comprises a two dimensional matrix of size N×N.

9. A method for increasing a scan rate in a photolithography system by increasing a unit travel length while maintaining a minimum resolution, the method comprising:

determining the minimum resolution;

determining a pixel spacing distance equal to the unit travel length;

calculating a window size based on the minimum resolution and the pixel spacing distance;

establishing a plurality of windows of the calculated size so that a first pixel in a first window is offset from a second pixel in a second window by the pixel spacing distance in a first dimension; and selecting one of the plurality of windows for projection onto a subject.

10. The method of claim 9 further comprising:

calculating an angle of rotation for a pixel panel, wherein the pixel panel is used to project the window onto the subject; and rotating the pixel panel to the calculated angle, wherein the rotation enables the first and second pixels to be projected onto the subject at the minimum resolution or a greater resolution.

11. The method of claim 10 further comprising using a digital mirror device for the pixel panel, wherein the window is reproduced using the digital mirror device.

12. The method of claim 9 further comprising repeatedly selecting and projecting the first and second pixels to form a straight line on the subject.

13. The method of claim 9 further comprising determining whether to select the first or second pixel for projection onto the subject, wherein the determination includes identifying which of the first and second discrete elements will match a desired exposure area when projected.

* * * * *